(12) United States Patent
Forrest et al.

(10) Patent No.: US 7,025,277 B2
(45) Date of Patent: Apr. 11, 2006

(54) SMART CARD COMPOSED OF ORGANIC PROCESSING ELEMENTS

(75) Inventors: Stephen R. Forrest, Princeton, NJ (US); Peter Peumans, Princeton, NJ (US)

(73) Assignee: The Trustees of Princeton University, Princeton, NJ (US)

( * ) Notice: Subject to any disclaimer, the term of this patent is extended or adjusted under 35 U.S.C. 154(b) by 459 days.

(21) Appl. No.: 09/956,085

(22) Filed: Sep. 20, 2001

(65) Prior Publication Data

US 2002/0104889 A1    Aug. 8, 2002

Related U.S. Application Data

(60) Provisional application No. 60/234,980, filed on Sep. 25, 2000.

(51) Int. Cl.
*G06K 19/06*    (2006.01)

(52) U.S. Cl. .................. 235/492; 235/454; 235/455; 438/99

(58) Field of Classification Search ............. 235/492, 235/454, 455; 438/99
See application file for complete search history.

(56) References Cited

U.S. PATENT DOCUMENTS

| | | | | |
|---|---|---|---|---|
| 4,742,573 A * | 5/1988 | Popovic | ..................... | 398/171 |
| 4,829,166 A * | 5/1989 | Froelich | ..................... | 235/379 |
| 4,916,296 A | 4/1990 | Streck | | |
| 5,119,356 A * | 6/1992 | Matsuoka et al. | ......... | 369/53.2 |
| 5,193,201 A | 3/1993 | Tymes | | |
| 5,434,401 A | 7/1995 | Bauser | | |
| 5,563,424 A | 10/1996 | Yang et al. | | |
| 5,693,956 A * | 12/1997 | Shi et al. | ...................... | 257/40 |
| 5,693,977 A * | 12/1997 | Haddon et al. | ............. | 257/431 |
| 5,734,154 A | 3/1998 | Jachimowicz et al. | | |
| 5,777,903 A * | 7/1998 | Piosenka et al. | ............ | 708/100 |
| 5,789,733 A * | 8/1998 | Jachimowicz et al. | ...... | 235/492 |
| 5,978,348 A * | 11/1999 | Tamura | ................... | 369/275.1 |
| 6,098,889 A * | 8/2000 | Ogawa et al. | ............. | 235/492 |
| 6,166,172 A * | 12/2000 | McCullough et al. | ....... | 528/380 |
| 6,335,539 B1 * | 1/2002 | Dimitrakopoulos et al. | .. | 257/40 |
| 6,429,040 B1 * | 8/2002 | Bao et al. | ..................... | 438/99 |
| 6,894,392 B1 * | 5/2005 | Gudesen et al. | ............ | 257/759 |

OTHER PUBLICATIONS

Peumans, et al., "Efficient photon harvesting at high optical intensities in ultrathin organic double-heterostruture photovoltaic diodes", Appl. Phys. Lett. 76: (19), pp. 2650-2652 (May 8, 2000).

(Continued)

*Primary Examiner*—Karl D. Frech
*Assistant Examiner*—Seung H Lee
(74) *Attorney, Agent, or Firm*—Kenyon and Kenyon LLP

(57) ABSTRACT

A smart card may include integrated circuitry and I/O components composed of organic materials. Organic materials are advantageous because they remain intact under instances of physical stress. They permit the smart card to undergo flexion from time to time without damaging the processing components thereon. Further, use of organic materials leads to reduced costs during manufacture. For example, the organic materials may be provided directly upon substrates composed of ordinary plastic materials thereby reducing the costs of manufacture of these smart cards when compared with smart cards that are made of traditional silicon-based integrated circuits.

10 Claims, 2 Drawing Sheets

OTHER PUBLICATIONS

C.W. Tang, "Two-layer organic photovoltaic cell", Appl. Phys. Lett. 48: (2), pp. 183-185 (Jan. 13, 1986).

Peumans, et al., "Efficient, high-bandwidth organic multilayer photodetectors", Appl. Phys. Lett. 76: (26), pp. 3855-3857 (Jun. 20, 2000).

H. Klauk, et al., "Pentacene organic thin-film transistors and ICs", Solid State Tech., 43: (3), pp. 63-76 (Mar. 2000).

H. Klauk et al., "Pentacene Organic Thin-Film Transistors for Circuit and Display Applications", IEEE Trans. Elec. Dev. 46: (6), pp. 1258-1263 (Jun. 6, 1999).

Z. Bao, "Materials and Fabrication Needs for Low-Cost Organic Transistor Circuits", Advanced Materials 2000, 12: (3), pp. 227-230.

Yang et al, "A New Architecture for Polymer Transistors", *Nature*, vol. 372, pp. 344-347, Nov. 24, 1994.

McElvain et al, "An Analytic Model for the Polymer Grid Triode", *J. Appl. Phys*, vol. 80, No. 8, pp. 4755-4766, Oct. 1996.

Wang et al, "Device Characteristics of Organic Static Induction Transistor Using Copper Phthalocyanine Films and Al Gate Electrode", 1999 Publication Board, *Japanese Journal of Applied Physics*, pp. 256-259, Oct. 19, 1998.

McElvain et al, "Fullerence-Based Polymer Grid Triodes", *J. Appl. Phys.*, vol. 8, No. 9, pp. 6468-6472, May 1, 1997.

Kudo et al, "Schottky Gate Static Induction Transistor Using Copper Phthalocyanine Films", Thin Solid Films 331, pp. 51-54, 1998.

Parker, S. P., "Organic Chemistry" McGraw-Hill Concise Encyclopedia of Science and Technology, Fourth Edition, pp 1365-1367.

G. Gustafsson et al., The Plastic LED: A Flexible Light-Emitting Device Using a Polyaniline Transparent Electrode, Synthetic Metals, 55-57, pp. 4123-4127 (1993).

* cited by examiner

300

SMART CARD COMPOSED OF ORGANIC PROCESSING ELEMENTS

This application claims the benefit of priority afforded by provisional application No. 60/234,980 filed Sep. 25, 2000.

The claimed invention was made by, on behalf of, and/or in connection with one or more of the following parties to a joint university-corporation research agreement: Princeton University, The University of Southern California, and the Universal Display Corporation. The agreement was in effect on and before the date the claimed invention was made, and the claimed invention was made as a result of activities undertaken within the scope of the agreement.

BACKGROUND

The present invention relates to smart card devices and, more particularly, to smart card devices having processing elements composed of organic materials.

Smart cards are known per se. They are processing devices provided in a credit card sized form factor. Smart cards may possess a processor and/or a memory. They typically exchange data with a larger computer system to affect commercial transactions, operate keycard systems or perform other networking functions.

Traditional smart cards provide the processor and/or memory in a traditional silicon-based integrated circuit. They also may include electronic or optical interfaces to exchange data with the larger system and may be powered by a battery or other power source.

The use of conventional silicon-based integrated circuits carries with it certain disadvantages. First, the integrated circuit does not tolerate physical stress. Smart cards routinely encounter flexion, twisting and other deforming forces during use as they are carried in wallets, pushed and pulled from card readers and deployed in the marketplace. These physical forces can damage the integrated circuits on a smart card unless they are carefully used. Second, the integrated circuit is expensive to manufacture. These disadvantages led the inventors to identify a need in the art for a smart card that avoids the limitations of the silicon-based integrated circuit.

SUMMARY

Embodiments of the present invention provide a smart card having integrated circuitry and I/O components composed of organic materials.

DETAILED DESCRIPTION

Embodiments of the present invention provide a smart card having integrated circuitry and I/O components composed of organic materials. Organic materials are advantageous because they may be fabricated on a wider variety of substrate materials than are permissible for traditional silicon-based integrated circuits. For a smart card application, the organic materials may be provided on a plastic substrate, one that remains intact under instances of physical stress. They permit the smart card to undergo flexion from time to time without damaging the processing components thereon. Further, use of organic materials leads to reduced costs during manufacture. For example, the organic materials may be provided directly upon substrates composed of ordinary plastic materials thereby reducing the costs of manufacture of these smart cards when compared with smart cards that are made of traditional silicon-based integrated circuits.

Figure 1:
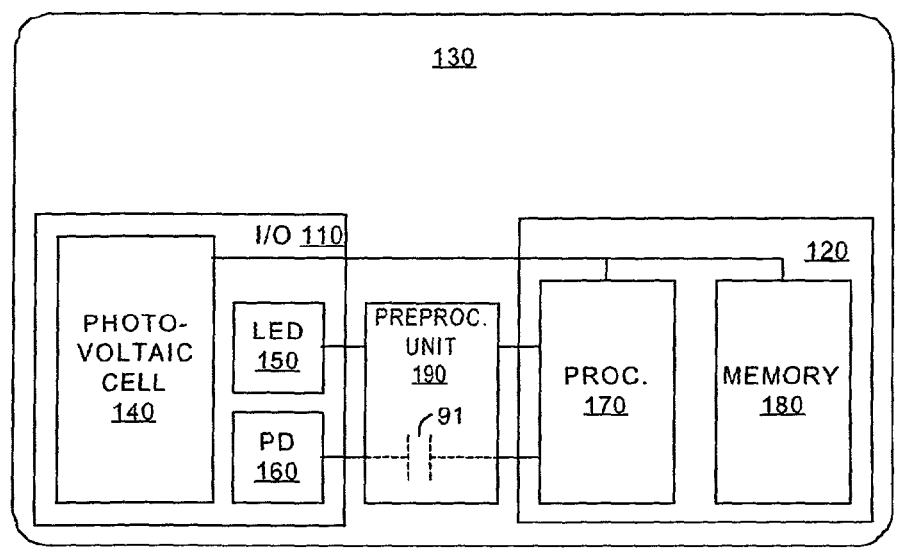
FIG. 1 is a schematic block diagram of a smart card according to an embodiment of the present invention.

FIG. 1 is a schematic block diagram of a smart card 100 constructed in accordance with an embodiment of the present invention. The smart card 100 may include an input/output ("I/O") system 110 and a processing unit 120 provided on a substrate 130. The I/O system 110 interfaces the smart card 100 with external equipment, such as a smart card reader (not shown). The processing unit 120 may perform conventional smart card processes such as registration and authentication and other applications necessary for the smart card to be deployed in the marketplace. Such applications are well-known.

In an embodiment, the I/O system 110 may include a photovoltaic cell 140, a light-emitting diode (LED) 150 and a photodetector (PD) 160. By using optical interfaces, the smart card 100 may be made less susceptible to degradation during use. For example, optical interfaces are not subject to wear in the same manner that contact-based electrical interfaces would be subject. In this manner, the optical interfaces benefit from a prolonged useful life.

In one embodiment, the photovoltaic cell 140 and the PD 160 may be embodied in a single unit. This embodiment is discussed in greater detail below.

The processing unit 120 may include a processor 170 and a memory 180. The processor 170 may be based upon any number of conventional architectures for processors. The memory 180 may include one or more memory architectures including random access memory, read only memory and non-volatile memory. The memory 180 may store instructions for execution by the processor 170 and data on which those executions may operate. The processing unit 120 may be powered by the photovoltaic cell 140. The processor 170 may output data to the LED 150 and receive data from the PD 160.

According to an embodiment, the smart card 100 also may include a preprocessing unit 190 provided in a communication path from the processing unit 120 to the LED 150 and the PD 160. The preprocessing unit 190 may perform signal conversion sufficient for the processing unit 120 to exchange intelligible data with the I/O system 110. For example, the preprocessing unit 190 may perform analog-to-digital conversion of an output signal from the PD 160 at a predetermined sample rate and output a digital data signal to the processing unit 120 representative of this conversion. Similarly, the preprocessing unit 190 may receive a digital data signal from the processing unit 120 and generate a driving signal to the LED 150 to generate an optical output from the smart card 100.

According to an embodiment, the smart card 100 may be powered by the photovoltaic cell 140. It is envisioned that the smart card 100 will be placed into a smart card interface unit (not shown). A high-intensity light beam will impact the photovoltaic cell 140 causing the cell to generate an output voltage and power the smart card 100. A lower intensity input optical data signal may impact the PD 160 and may be captured by the smart card 100. The LED 150 may generate an output optical data signal to be read by the smart card interface unit.

Figure 2:
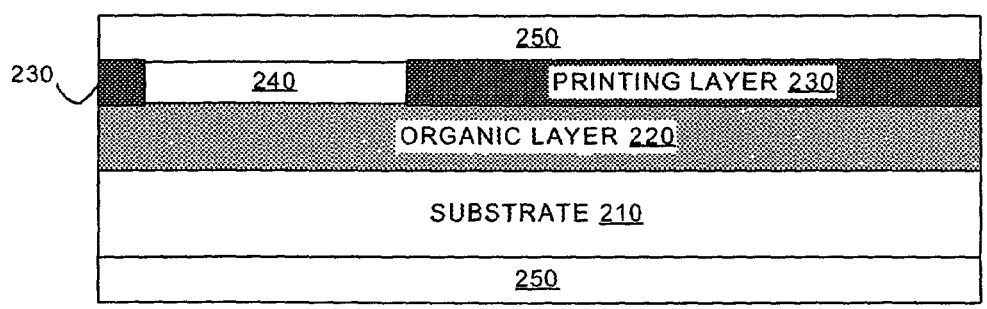
FIG. 2 is a sectional illustration of a smart card according to an embodiment of the present invention.

FIG. 2 is a schematic diagram of a cross-sectional view of a smart card 200 according to an embodiment of the present invention. As illustrated in FIG. 2, manufacture of the smart card 200 may be achieved in various layers. FIG. 2 illustrates a substrate material 210 on which a layer of organic materials, organic layer 220, may be disposed. The I/O system 110, processing unit 120 and preprocessing unit 190 of FIG. 1 may be formed in the organic layer. Again, the I/O system 110, processing unit 120 and preprocessing unit 190 may be composed entirely of organic materials.

Other layers may be provided upon the organic layer. For example, as shown in FIG. 2, a smart card 200 may include a printing layer 230 on which consumer-perceptible information may be printed. The smart card further may include other layers of substrate or laminate to protect the smart card from physical abuse. FIG. 2, for example, illustrates a pair of laminate layers 250 provided on opposite faces of the smart card 200.

According to an embodiment, the ancillary layers of the smart card 200 are provided in such a way so as not to impair the functionality of the I/O system 110. For example, FIG. 2 illustrates a window 240 in the printing layer 230. This window 240 may be appropriate to prevent the printing layer 230 from obscuring LEDs, PDs or photo-voltaic cells of the I/O system 110. In an embodiment, the laminate layers 250, ancillary substrates (not shown) and printing layers 230 of the smart card 200 may be of a material that is transparent to the wavelengths of light used to exchange information between the smart card 200 and its external environment (not shown).

Figure 3:
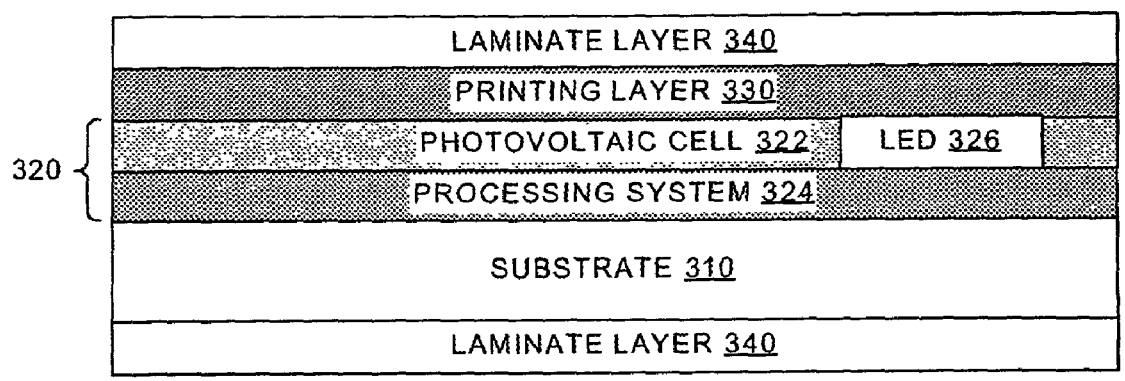
FIG. 3 is a sectional illustration of a smart card according to an embodiment of the present invention.

According to an embodiment, shown in FIG. 3, the organic layer may itself be comprised of a plurality of sub-layers (not shown) of organic material. FIG. 3 illustrates a smart card 300 populated by a substrate 310, an organic layer 320, a printing layer 330 and laminate layers 340. In this embodiment, an outer-most sub-layer 322 of the organic layer 320 may provide elements of the I/O system 110 illustrated in FIG. 1. Other interior layers 324 may provide elements of the processing system 120. These layers 322, 324 may be separated by interstitial insulative layers (not shown) that maintain data coherency among the functional units. This configuration is advantageous because almost the entire outer layer 322 of the card 300 may be provided as a photovoltaic cell, with exception of an area 326 that is provided as an optical emitter, such as an LED. During manufacture, regulation of light-obscuring layers such as the printing layer 330 is made subject to less stringent design tolerances. Rather than precisely regulating the areas on the card where a distributor may print information, a distributor may be free to print on arbitrary portions of the card surface so long as the printing does not obscure a predetermined percentage of the card's surface area.

Figure 4:
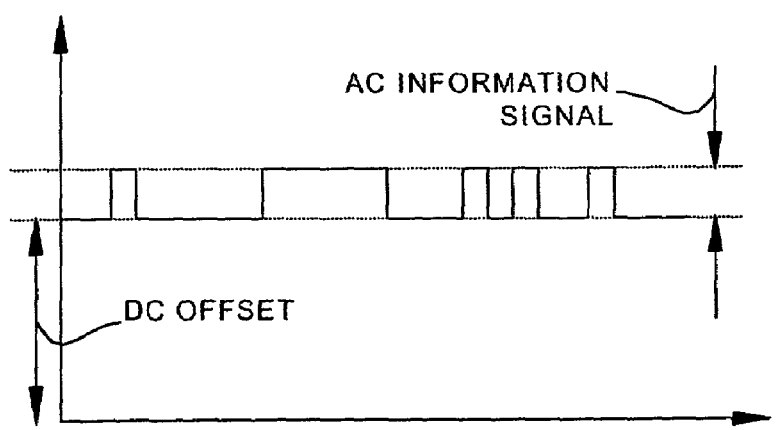
FIG. 4 is a signal diagram illustrating electrical signals within a smart card according to an embodiment of the present invention.

In another embodiment, the photovoltaic cell 140 and PD 160 may be integrated into a unitary optical receiving element. During operation in this embodiment, a single light beam may impact the optical receiving element. The light beam may possess a high-intensity DC component and a lower-intensity AC component carrying data. In this embodiment, after having been sampled by the preprocessing unit 190, the captured signal may have a form as shown in FIG. 4. The preprocessing unit 190 may further process the captured signal by stripping off the DC offset from the captured signal and outputting a data signal to the processing unit representing only the AC information signal. For example, a capacitor 191 may be included in the preprocessing unit 190, and disposed between the PD 160 and processor 170 to strip off the DC offset from the captured signal.

In the embodiment having the unitary optical receiving element, the processing system 120 may be powered by a separate conductive path that bypasses the preprocessing unit 190.

As described, the photovoltaic cell 140, LED 150, PD 160, processor 170, memory 180 and preprocessing unit 190 may be provided as organic integrated circuits and organic photo-active elements. The following discussion describes exemplary materials that may be provided for each of these elements.

According to an embodiment, the photo-voltaic cell 140 may include at least two materials, a donor material and an acceptor material, provided in contact with each other. A contact area provided by the two materials generates the photo-voltaic action. Typically, the donor materials is characterized by low ionization potential ("IP") and the acceptor material is characterized by a high electron affinity. A first contact, an anode, may be provided on the donor material. The anode may have a high workfunction and may permit extraction of holes without significant loss in hole energy. A second contact, a cathode, may be provided on the acceptor material. The cathode may have a low workfunction and may permit electrons to be extracted with significant electron energy loss.

By way of example, a photo-voltaic cell 140 may be realized from a 50 nm donor layer of CuPc and a 50 nm acceptor layer of PTCBI with an anode of 200 nm ITO and a cathode of 80 nm Ag. Additional efficiencies may be obtained from a photo-voltaic cell 140 that integrates an exciton-blocking layer between the photoactive organic layers and the cathode. For example, under the high illumination intensities that are appropriate for smart card applications, a photo-voltaic cell of ITO/CuPc/PTCBI/BCP/Ag may exhibit a power conversion efficiency of ~1%, which can cause about 10 mW of power to be transferred to the card per $cm^2$ of the photo-voltaic cell 140. Other examples are reported in Peumans, Appl. Phys. Lett. 76: (19) 2650–2652 (May 8, 2000), and C. W. Tang., Appl. Phys. Lett. 48: (2) 183–185 (Jan. 13, 1986).

The photodetector 160 may be manufactured from similar materials as the photo-voltaic cell 140. Peumans, et al., Appl. Phys. Lett. 76: (26) 3855–3857 (Jun. 20, 2000) describe appropriate materials for use in a photodetector.

In an embodiment, the LED 150 may be one of a variety of organic light emitting diodes (an "OLED"). OLEDs are well-known in the art.

In an embodiment, the processor 170 and the memory 180 each may be part of an integrated circuit compiled from organic triodes or from thin-film transistors such as those described in Jackson, et al., Solid State Tech. 43: (3) 63(March 2000), IEEE Trans. Elec. Dev. 46: (6) 1258–1263 (June 1999); Bell Labs., Advanced Materials, 12:(3) 227 (Feb. 3, 2000) either embodiment, the devices may be manufactured from crystalline organic semiconductors such as CuPc, PTCDA, $F_{16}CuPc$, 6T or pentacene.

As described, the preprocessing unit 190 facilitates signal transition between the processing unit 120 and the I/O system 110. In a simple embodiment, the preprocessing unit 190 simply may be provided as capacitive coupling between the two systems and signal amplification for out-bound signals (those to be transmitted by the LED 150). Alternatively, the preprocessing unit 190 may be provided as a separate integrated circuit with dedicated control processes.

In this latter embodiment, the preprocessor 190 may be fabricated using the techniques described above with respect to the processor 170 and the memory 180.

Table 1 below lists the materials referenced by the acronyms in the preceding discussion:

TABLE 1

| Acronym | Material |
| --- | --- |
| CuPc | Copper-Phthalocyanine |
| PTCDA | 3,4,9,10-perylene tetracarboxylic dianhydride |
| PTCBI | 3,4,9,10-perylene tetracarboxylic bisbenzimidazole |
| F16CuPc | fluorinated CuPc |
| 6T | sexithiophene |
| BCP | bathocuproine |

Several embodiments of the present invention are specifically illustrated and described herein. However, it will be appreciated that modifications and variations of the present invention are covered by the above teachings and within the purview of the appended claims without departing from the spirit and intended scope of the invention.

We claim:

1. A smart card for communicating with an optical interface of an external system, the smart card comprising:
   an organic photo detector disposed on said smart card for receiving an optical input signal from said optical interface, said optical input signal carrying digital data received from said optical interface;
   an organic light emitting diode disposed on said smart card for transmitting an optical output signal to said optical interface, said output optical signal for carrying digital data transmitted to said optical interface;
   an organic integrated circuit logic disposed on said smart card and coupled to said photo detector and said light emitting diode, said circuit logic for at least processing said received data and said transmitted data; and
   an organic photovoltaic cell disposed on said smart card and coupled to said circuit logic, said photovoltaic cell for providing power to said circuit logic.

2. The smart card recited in claim 1, wherein said organic photovoltaic cell for receiving said optical input signal from said optical interface and for converting said optical input signal into electrical current for powering said circuit logic are integrated into a unitary optical receiving element.

3. The smart card as recited in claim 1, wherein said photodetector and said photovoltaic cell are responsive to the same optical input signal.

4. The smart card as recited in claim 3, wherein said optical input signal having a DC component for powering said circuit logic.

5. The smart card as recited in claim 4, wherein said optical input signal having a AC component for carrying digital data received from said optical interface.

6. The smart card as recited in claim 5, further comprising: an isolating circuit disposed on said smart card between said photo detector and said circuit logic, said isolating circuit for isolating said DC component from said AC component so that the AC component carrying said digital data is passed on to said circuit logic for processing.

7. The smart card as recited in claim 6, wherein said isolating circuit comprises a capacitor.

8. The smart card as recited in claim 6, wherein said isolating circuit comprises a differential analog to digital converter.

9. The smart card as recited in claim 1, comprising a plastic substrate.

10. The smart card as recited in claim 1, further comprising a memory disposed on said smart card for storing said digital data.

* * * * *

UNITED STATES PATENT AND TRADEMARK OFFICE
CERTIFICATE OF CORRECTION

| | | |
|---|---|---|
| PATENT NO. | : 7,025,277 B2 | Page 1 of 1 |
| APPLICATION NO. | : 09/956085 | |
| DATED | : April 11, 2006 | |
| INVENTOR(S) | : Stephen R. Forrest et al. | |

It is certified that error appears in the above-identified patent and that said Letters Patent is hereby corrected as shown below:

Column 4, line 19, change "materials is" to -- material is --

Column 6, line 17, change "having a AC" to -- having an AC --

Signed and Sealed this

Tenth Day of October, 2006

JON W. DUDAS
*Director of the United States Patent and Trademark Office*